United States Patent
Pagliaro, Jr.

(10) Patent No.: US 8,765,606 B2
(45) Date of Patent: *Jul. 1, 2014

(54) SILICON SURFACE PREPARATION

(75) Inventor: Robert H. Pagliaro, Jr., Mesa, AZ (US)

(73) Assignee: ASM America, Inc., Phoenix, AZ (US)

( * ) Notice: Subject to any disclaimer, the term of this patent is extended or adjusted under 35 U.S.C. 154(b) by 838 days.

This patent is subject to a terminal disclaimer.

(21) Appl. No.: 12/251,206

(22) Filed: Oct. 14, 2008

(65) Prior Publication Data

US 2009/0042400 A1 Feb. 12, 2009

Related U.S. Application Data

(63) Continuation of application No. 11/210,441, filed on Aug. 23, 2005, now Pat. No. 7,479,460.

(51) Int. Cl.
*H01L 21/306* (2006.01)
*H01L 21/02* (2006.01)

(52) U.S. Cl.
CPC .............................. *H01L 21/02052* (2013.01)
USPC .... 438/689; 438/745; 438/787; 257/E21.224; 134/1; 134/20

(58) Field of Classification Search
USPC .......... 438/689, 787; 134/1, 20; 257/E21.224
See application file for complete search history.

(56) References Cited

U.S. PATENT DOCUMENTS

| | | | |
|---|---|---|---|
| 4,582,624 A | 4/1986 | Enjo et al. | |
| 4,856,544 A | 8/1989 | McConnell | |
| 4,885,056 A | 12/1989 | Hall et al. | |
| 4,899,767 A | 2/1990 | McConnell et al. | |
| 5,022,961 A | 6/1991 | Izumi et al. | |
| 5,051,134 A | 9/1991 | Schnegg et al. | |
| 5,308,400 A | 5/1994 | Chen | |
| 5,330,577 A | 7/1994 | Maeda et al. | |
| 5,454,901 A | 10/1995 | Tsuji | |
| 5,464,480 A | 11/1995 | Mathews | |

(Continued)

FOREIGN PATENT DOCUMENTS

| | | |
|---|---|---|
| CN | 1432531 A | 7/2003 |
| DE | 198 55 394 A1 | 6/1999 |

(Continued)

OTHER PUBLICATIONS

Celik et al. "Low thermal budget surface preparation for selective epitaxy: A study on process robustness," *Journal of the Electrochemical Society*, 1999, vol. 146, No. 4, ppl. 1557-1564.

(Continued)

*Primary Examiner* — Nadine Norton
*Assistant Examiner* — Mahmoud Dahimene
(74) *Attorney, Agent, or Firm* — Knobbe, Martens, Olson & Bear LLP

(57) ABSTRACT

Methods are provided for producing a pristine hydrogen-terminated silicon wafer surface with high stability against oxidation. The silicon wafer is treated with high purity, heated dilute hydrofluoric acid with anionic surfactant, rinsed in-situ with ultrapure water at room temperature, and dried. Alternatively, the silicon wafer is treated with dilute hydrofluoric acid, rinsed with hydrogen gasified water, and dried. The silicon wafer produced by the method is stable in a normal clean room environment for greater than 3 days and has been demonstrated to last without significant oxide regrowth for greater than 8 days.

27 Claims, 3 Drawing Sheets

(56) References Cited

U.S. PATENT DOCUMENTS

| | | | |
|---|---|---|---|
| 5,470,393 | A | 11/1995 | Fukazawa |
| 5,509,970 | A | 4/1996 | Shiramizu |
| 5,601,656 | A | 2/1997 | Li |
| 5,656,097 | A | 8/1997 | Olesen et al. |
| 5,665,168 | A | 9/1997 | Nakano et al. |
| 5,679,171 | A | 10/1997 | Saga et al. |
| 5,681,397 | A | 10/1997 | Li |
| 5,759,971 | A | 6/1998 | Manako |
| 5,783,495 | A | 7/1998 | Li et al. |
| 5,810,940 | A | 9/1998 | Fukazawa et al. |
| 5,814,157 | A | 9/1998 | Mizuniwa et al. |
| 5,837,662 | A | 11/1998 | Chai et al. |
| 5,855,077 | A | 1/1999 | Nam et al. |
| 5,883,060 | A | 3/1999 | Lim et al. |
| 5,904,574 | A | 5/1999 | Nishijima |
| 5,908,509 | A | 6/1999 | Olesen et al. |
| 5,932,022 | A | 8/1999 | Linn et al. |
| 5,948,161 | A | 9/1999 | Kizuki |
| 5,950,645 | A | 9/1999 | Olesen et al. |
| 5,996,595 | A | 12/1999 | Olesen et al. |
| 6,003,243 | A | 12/1999 | Ohmi |
| 6,106,634 | A | 8/2000 | Ghanayem et al. |
| 6,158,445 | A | 12/2000 | Olesen et al. |
| 6,319,331 | B1 | 11/2001 | Kume et al. |
| 6,332,981 | B1 | 12/2001 | Loyd |
| 6,346,505 | B1* | 2/2002 | Morita et al. .......... 510/175 |
| 6,348,157 | B1 | 2/2002 | Ohmi et al. |
| 6,416,586 | B1 | 7/2002 | Ohmi et al. |
| 6,494,223 | B1 | 12/2002 | Ohmi et al. |
| 6,620,743 | B2* | 9/2003 | Pagliaro et al. .......... 438/787 |
| 6,726,848 | B2 | 4/2004 | Hansen et al. |
| 7,108,748 | B2 | 9/2006 | Brabant et al. |
| 7,179,746 | B2 | 2/2007 | Ohmi et al. |
| 7,462,239 | B2 | 12/2008 | Brabant et al. |
| 7,479,460 | B2* | 1/2009 | Pagliaro, Jr. .......... 438/745 |
| 7,837,795 | B2 | 11/2010 | Brabant et al. |
| 2002/0179112 | A1* | 12/2002 | Winters .......... 134/2 |
| 2003/0132104 | A1 | 7/2003 | Yamashita et al. |
| 2003/0188770 | A1* | 10/2003 | Doi .......... 134/102.1 |
| 2003/0192577 | A1* | 10/2003 | Thakur et al. .......... 134/146 |
| 2004/0108575 | A1* | 6/2004 | Ohmi et al. .......... 257/627 |
| 2004/0127032 | A1* | 7/2004 | Peng et al. .......... 438/689 |
| 2005/0126030 | A1* | 6/2005 | Ohmi et al. .......... 34/58 |
| 2007/0049056 | A1 | 3/2007 | Pagliaro |
| 2007/0145535 | A1 | 6/2007 | Ohmi et al. |

FOREIGN PATENT DOCUMENTS

| | | |
|---|---|---|
| EP | 0 700 077 A2 | 3/1996 |
| EP | 0 805 484 A1 | 11/1997 |
| EP | 0 848 088 A1 | 6/1998 |
| EP | 0 936 268 A2 | 8/1999 |
| EP | 1 427 003 A2 | 6/2004 |
| JP | 08-195369 | 7/1996 |
| JP | 11-57636 | 3/1999 |
| JP | 2000-070885 | 3/2000 |
| JP | 2000-228387 | 8/2000 |
| JP | 2002-329701 | 11/2002 |
| JP | 2003-007671 | 1/2003 |
| JP | 2003-007671 | 10/2003 |
| JP | 2004-533118 | 10/2004 |
| JP | 2005-051141 | 2/2005 |
| KR | 10-2002-0063201 | 8/2002 |
| WO | WO 02/29857 A1 | 4/2002 |
| WO | WO 02/097864 A2 | 12/2002 |

OTHER PUBLICATIONS

Itano et al., "Particle removal from silicon wafer surface in wet cleaning process," *Semiconductor Manufacturing, IEEE Transactions on*, Aug. 1993, vol. 6, Issue 3, pp. 258-267.

Kluth et al., "Oxidation mechanism of the ammonium-fluoride-treated Si(100) surface," *J. Appl. Phys.*, Nov. 1, 1996, vol. 80, No. 9, pp. 5408-5414.

Lester, Maria A., "IMEC—Clean, RCA Replacement," *Semiconductor International*, Aug. 2000, p. 62.

Mende, G., "Oxidation of etched silicon in air at room temperature; measurements with ultrasoft x-ray photoelectron spectroscopy (ESCA) and neutron activation analysis," *Surface Science*, 1983, vol. 128, pp. 169-175.

Olson et al., "Alternatives to standard wet cleans," *Semiconductor International*, Aug. 2000, pp. 70-76.

Pagliaro, Non-Final Office Action dated Jul. 31, 2007, U.S. Appl. No. 11/210,441, filed Aug. 23, 2005, "Silicon Surface Preparation," 18 pages.

Pagliaro, Response to Non-Final Office Action filed Oct. 30, 2007, U.S. Appl. No. 11/210,441, filed Aug. 23, 2005, "Silicon Surface Preparation," 10 pages.

Pagliaro, $2^{nd}$ Non-Final Office Action dated Jan. 28, 2008, U.S. Appl. No. 11/210,441, filed Aug. 23, 2005, "Silicon Surface Preparation," 16 pages.

Pagliaro, Response to $2^{nd}$ Non-Final Office Action filed Apr. 8, 2008, U.S. Appl. No. 11/210,441, filed Aug. 23, 2005, "Silicon Surface Preparation," 11 pages.

Pagliaro, Final Office Action dated Aug. 5, 2008, U.S. Appl. No. 11/210,441, filed Aug. 23, 2005, "Silicon Surface Preparation," 12 pages.

Pagliaro, Response to Final Office Action filed Sep. 24, 2008, U.S. Appl. No. 11/210,441, filed Aug. 23, 2005, "Silicon Surface Preparation," 7 pages.

Steinman, A., "Controlling static charge in spin rinser dryers," *Semiconductor International*, Aug. 1998, p. 86.

Takahagi et al., "The formation of hydrogen passivated silicon single-crystal surfaces using ultraviolet cleaning and HF etching," *J, Appl. Phys.*, 1998, vol. 64, No. 7, pp. 3516-3521.

Van Der Heide et al., "Etching of thin $SiO_2$ layers using wet HF gas," *J. Vac. Sci. Technol.*, 1989, vol. 7, No. 3, pp. 1719-1723.

Yokoi et al., "A hydrogenated water application to semiconductor manufacturing," Diffusion and Defect Data Part B, Solid State Phenomena, 2001, pp. 71-74, vol. 76-77, Balabian Publishers, Switzerland.

* cited by examiner

SILICON SURFACE PREPARATION

CROSS-REFERENCE TO RELATED APPLICATIONS

This application is a continuation of U.S. patent application Ser. No. 11/210,441, filed Aug. 23, 2005, which is incorporated herein by reference in its entirety.

This application is also related to U.S. Pat. No. 6,620,743 to Pagliaro et al., filed Mar. 26, 2001.

BACKGROUND OF THE INVENTION

1. Field of the Invention

This invention relates to methods for preparing a clean and stable silicon surface.

2. Description of the Related Art

Clean semiconductor surfaces are a key factor in preparing integrated circuits with high yields. There are two major types of contamination that occur on semiconductor surfaces: films and particulates. Particulates are materials that have readily defined boundaries, while films (for example, native oxide on a bare silicon surface) are layers of material on the surface of the wafer.

It is important to minimize or eliminate both films and particulates on the surface of the silicon wafer in order to optimize integrated circuit yields. Prior to epitaxial deposition and diffusion processes on bare silicon surfaces, particularly for processes conducted at less than about 850° C., it is important to have a clean silicon surface.

Particulates and films may be removed through cleaning. The standard cleaning method often involves one or more forms of an RCA cleaning procedure. The RCA Standard-Clean-1 (SC-1) procedure uses a mixture of hydrogen peroxide, ammonium hydroxide, and water heated to a temperature of about 70° C. The SC-1 procedure dissolves films and removes Group I and II metals. The Group I and II metals are removed through complexing with the reagents in the SC-1 solution.

The RCA Standard-Clean-2 (SC-2) procedure utilizes a mixture of hydrogen peroxide, hydrochloric acid, and water heated to a temperature of about 70° C. The SC-2 procedure removes the metals that are not removed by the SC-1 procedure. If an oxide-free surface is required, the silicon wafer is dipped into an aqueous solution of hydrofluoric acid to etch away the native oxide layer and, theoretically, obtain hydrogen termination. There are a large number of variations on RCA clean and hydrofluoric acid dips.

After cleaning, wafers are typically stored for a period of time before further processing. Silicon-fluorine and silicon-carbon bonds are often observed on the silicon surface after cleaning. The fluorine and carbon contamination on the surface may be detrimental to the thermal budget and/or the quality of the layer to be grown or deposited on the surface of the wafer.

If the silicon wafer is dipped in hydrofluoric acid as the last cleaning step (also known as an "HF last" step), the surface of the silicon is typically terminated mostly with a monolayer of hydrogen, largely Si—H bonds. The hydrogen-terminated surface prevents oxidation better than without any termination. However, the surface of a silicon wafer after an HF last treatment normally starts to reoxidize within about 20 minutes after the original oxide layer was removed, quickly forming a new 5 Å to 7 Å thick oxide layer on the surface of the silicon wafer. Even with the best cleaning processes currently known, a layer of native oxide forms within 48 hours, and, often the wafers cannot be further processed within that time.

This will mandate a new HF dip or in situ vapor clean if an oxide-free surface is required for the next process step.

In an HF last, when the oxide layer is removed from the surface with a hydrofluoric acid solution as the final step in the cleaning procedure, the wafer surface has a tendency to have high levels of particles due to: 1) exposure to contaminants in the solution; 2) exposure to air at the air/liquid interface; 3) deposition of particles during the drying process; and 4) exposure to air during the time between the drying step and the time that the silicon wafer is placed in an inert environment.

U.S. Pat. No. 6,620,743 to Pagliaro et al. teaches a method for forming a stable, oxide-free silicon surface. The '743 patent teaches an optimized APM clean, followed by a dilute HF etch, then an in situ rinse, and a dry only spin dry. The method taught by the '743 patent achieve silicon surfaces with a desirable level of stability, but is disadvantageous in certain respects. For example, the method requires short time intervals between its processes, is time-consuming, and utilizes expensive equipment.

Accordingly, there is a need for improved methods of preparing a clean and stable silicon surface.

SUMMARY OF THE INVENTION

In accordance with one aspect of the invention, a method is provided for preparing a silicon surface. The method includes treating the silicon surface with dilute hydrofluoric acid comprising anionic surfactant, and then rinsing and drying the silicon surface.

In the illustrated embodiments, a dilute HF dip is carried out that includes 20 to 200 ppm of anionic surfactant. The dilute HF solution is then rinsed away in-situ, and the substrate (e.g., silicon wafer) is dried. Drying is carried out using heated, ionized, high purity purge gas (i.e., $N_2$, Ar) or isopropyl alcohol. Advantageously, the treating and rinsing steps employ ultrapure water with a resistivity at 25° C. of greater than 16 MΩ-cm and less than 10 ppb total oxidizable carbon, less than 10 ppb dissolved silica, and less than 500 ppb dissolved oxygen. The treating, rinsing, and drying are all carried out in a single vessel processor. This process has been shown to demonstrate a particle removal efficiency of 35%-55%, with native oxide growth limited to less than 1 Å after exposure to clean room air for more than about 5 days. Notably, these results are achieved without the use of an APM clean.

In accordance with another aspect of the invention, a method is provided for forming an integrated circuit. The method includes treating a surface of the integrated circuit with aqueous hydrofluoric acid comprising anionic surfactant. In an illustrated embodiment, the anionic surfactant has a concentration of 20 to 200 ppm and is configured to charge the zeta potential of particles on the surface of the integrated circuit negatively.

In accordance with another aspect of the invention, a method is provided for preparing a silicon surface by treating the surface with dilute hydrofluoric acid, rinsing the surface with hydrogen gasified water, and drying the surface. In the illustrated embodiments, the hydrogen gasified water has a dissolved hydrogen concentration of 1.2 to 1.6 ppm. Rinsing is carried out for approximately 2-3 minutes and includes megasonic energy at 900 to 1000 kHz. This process has been shown to demonstrate a particle removal efficiency of greater than 95%, with native oxide growth limited to less than 1 Å after exposure to clean room air for more than about 5 days.

In accordance with another aspect of the invention, a method is provided for forming an integrated circuit, which method includes exposing a surface for formation of the integrated circuit to hydrogen gasified water.

In accordance with another aspect of the invention, a method is provided for preparing water for semiconductor processing. The method includes hydrogen gasification of the water.

In accordance with another aspect of the invention, a method is provided whereby water is exposed to ultraviolet radiation, filtered, degasified and gasified with hydrogen.

DETAILED DESCRIPTION OF THE PREFERRED EMBODIMENT

Embodiments of the method of the present invention provide a method for producing silicon wafers having pristine, hydrogen-terminated stable surfaces. Oxide re-growth on the silicon surface produced with some embodiments has been shown to be inhibited in a clean room environment for over 5 days, and in some cases for more than 8 days. As discussed above, the method described in the '743 patent achieves stability against significant native oxide growth for up to 8 days. However, that method demands significant capital, in the form of chemicals, equipment, and power consumption. Another significant capital expenditure is the additional cycle time consumed by the APM clean during the production of a silicon surface. Furthermore, chemicals used in the APM clean may have the potential to introduce safety or environmental hazards. Moreover, as mentioned above, the APM clean risks contaminating the silicon surface with metals. Perhaps most importantly, the APM clean disadvantageously consumes silicon that is part of the substrate. Known methods for APM cleans typically consume approximately 3-5 Å of a silicon surface. A loss of this thickness of silicon becomes increasingly problematic as features and components of integrated circuit devices become smaller.

Certain embodiments of the present invention achieve stability without the need for the costly and time-consuming step of an APM clean (although other embodiments provide for the optional use of an APM clean). The preferred embodiments therefore provide a method of preparing a stable silicon surface in a more time- and cost-efficient manner than known production methods. Although the embodiments of the method of the invention are described in the context of cleaning a bare silicon wafer, it is to be understood that the preferred embodiments have broad applicability to cleaning a wide range of surfaces.

Figure 1:
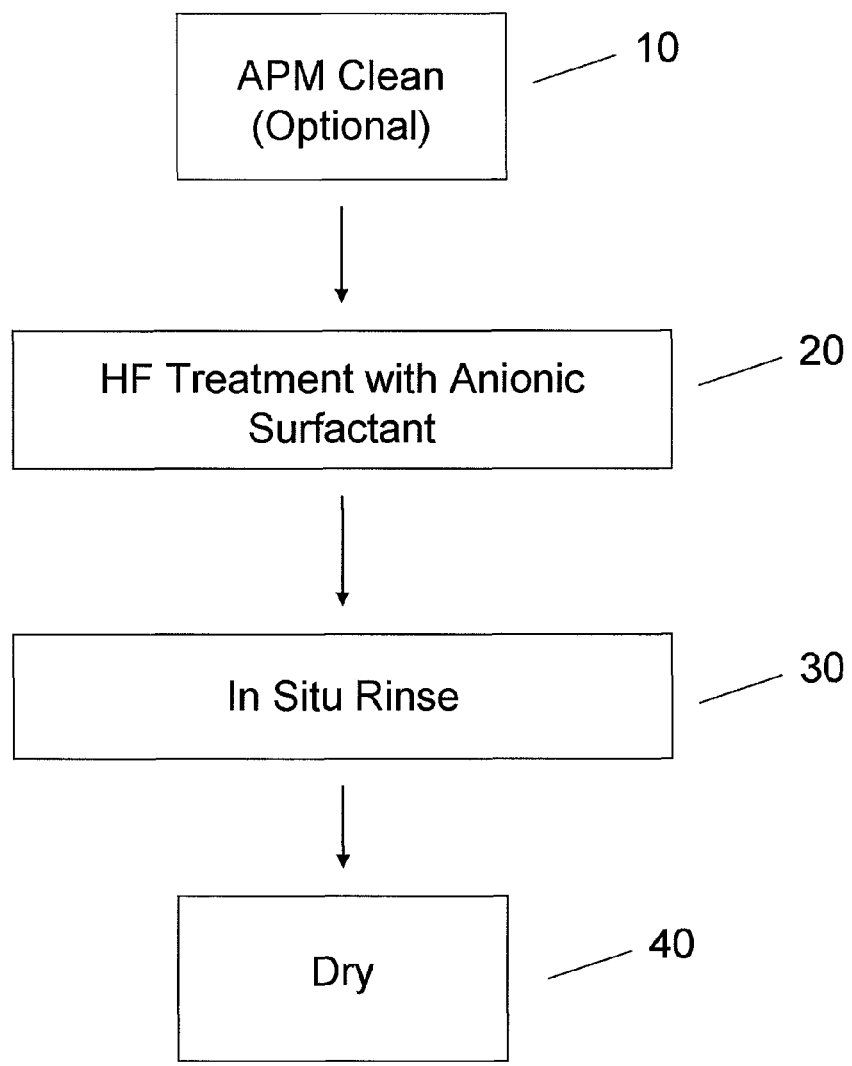
FIG. 1 is a block diagram illustrating a method of preparing a silicon surface according to embodiments of the present invention.

FIG. 1 shows the steps in an embodiment of the present invention. The first step 10 is an optional cleaning of the wafer with a mixture of ammonium hydroxide and hydrogen peroxide, known in the industry as an ammonium hydroxide/peroxide mixture (APM). The second step 20 is a treatment with dilute hydrofluoric acid with an anionic surfactant. The third step 30 is an in-situ rinse, and the fourth step 40 is a substrate drying step. Each of these steps will be described in more detail below.

Ammonium Hydroxide/Hydrogen Peroxide Cleaning

Step 10 of FIG. 1 involves optionally cleaning the silicon wafer with an ammonium hydroxide/hydrogen peroxide mixture (APM). The ammonium hydroxide/hydrogen peroxide cleaning step 10 of the preferred embodiment uses a solution of 800 mL to 1,000 mL of 30% hydrogen peroxide, 300 mL to 600 mL of 29% ammonium hydroxide and 11 gallons (41 L) of water. Thus, the total bath concentration is preferably 0.50% to 0.80% by volume ammonium hydroxide, more preferably 0.58% to 0.73% ammonium hydroxide. The total bath concentration is preferably between about 0.10% to 0.50% hydrogen peroxide, more preferably about 0.21% to 0.42% hydrogen peroxide. The solution is preferably maintained at a temperature of about 20° C. to 50° C., more preferably 30° C.-40° C. and the wafer is maintained in the solution for about 5 minutes to 15 minutes. The APM solution of step 10 of FIG. 1 is similar to the SC-1 solution of the RCA cleaning process.

The APM cleaning step 10 removes particles, surface defects, and Group I and Group II metals from the silicon wafer in the process of growing a chemical oxide. The APM cleaning may be done in an open vessel bath or other suitable vessel. Open vessel baths are commercially available. The Superior Automation Recirculating Bath, commercially available from Superior Automation, San Jose, Calif. is an exemplary open vessel bath which is suitable for use in the optional APM cleaning step 10. Other open vessel baths are suitable for the optional APM cleaning step 10. Furthermore, the optional APM cleaning step 10 is not limited to open vessel baths.

Dilute Hydrofluoric Acid Treatment

The dilute hydrofluoric (dHF) acid treatment step 20 of FIG. 1 may be performed after the APM cleaning step 10 or as a first step in the preparation of a silicon surface.

The dilute hydrofluoric acid for the dilute hydrofluoric acid treatment step 20 preferably has a concentration of approximately 0.25% to 1.0% by volume (vol. %) hydrogen fluoride HF, more preferably about 0.25 wt. % to 0.5 wt. % HF. Use of a dilute hydrofluoric acid for the treatment step 20 minimizes contamination on the surface of the silicon wafer. The dilute hydrofluoric acid is preferably heated to a temperature of about 30° C. to 50° C., more preferably at about 40° C., to minimize particles and to enhance hydrogen termination on the surface of the silicon wafer. The heated dilute hydrofluoric acid treatment also provides for uniform oxide etch rates on the entire surface of the silicon wafer. The silicon wafer is preferably exposed to the dilute hydrofluoric acid treatment for a time period of between about 20 seconds and 2 minutes, more preferably for a time period of between about 40 seconds and 60 seconds, and most preferably for a time period of approximately 60 seconds. Thus, the silicon wafer can be treated with dilute hydrofluoric acid having a concentration of approximately 0.5 vol. % hydrogen fluoride at a temperature of approximately 40° C. for approximately 60 seconds.

The dilute hydrofluoric acid used in treatment step 20 of the illustrated embodiment includes a surfactant. Preferably, the surfactant is an anionic surfactant, which charges the zeta potential of particles suspended in the bath chemistry and on the silicon surface negatively. The negative charging of those particles serves to dissociate the particles from the similarly charged silicon surface. Thus, the anionic surfactant aids in removing contaminating particles from the surface of the silicon by changing their zeta potential to a negative charge and causing a repulsive force to liberate them from the negatively charged silicon surface. Anionic surfactant is particularly helpful in removing polymeric particles such as PEEK and Teflon from hydrophobic surfaces. Furthermore, anionic surfactants advantageously prevent metal ion deposition. In addition, if the anionic surfactants are used in a buffered hydrofluoric acid solution, the anionic surfactants can prevent microroughness generation. In the preferred embodiment, the anionic surfactant has a concentration of 20 to 200 ppm. The surfactant may be an organic surfactant, such as hydrocarbonic sulfate or perfluorocarbonate.

The ultrapure water used to form the dilute hydrofluoric acid has high resistivity, indicating that the metals levels are low. By using water having high resistivity to form the dilute hydrofluoric acid, the quantity of metals which are deposited on the silicon wafer during the dilute hydrofluoric acid treatment step 20 is minimized. The water used to form the dilute hydrofluoric acid has a resistivity greater than about 15 megaohms-cm (M$\Omega$-cm) at a temperature of 25° C., and most preferably a resistivity of at least about 17.5 M$\Omega$-cm. The total oxidizable carbon (TOC) and the dissolved silica are also preferably minimized to levels of less than 10 ppb (parts per billion).

Figure 3:
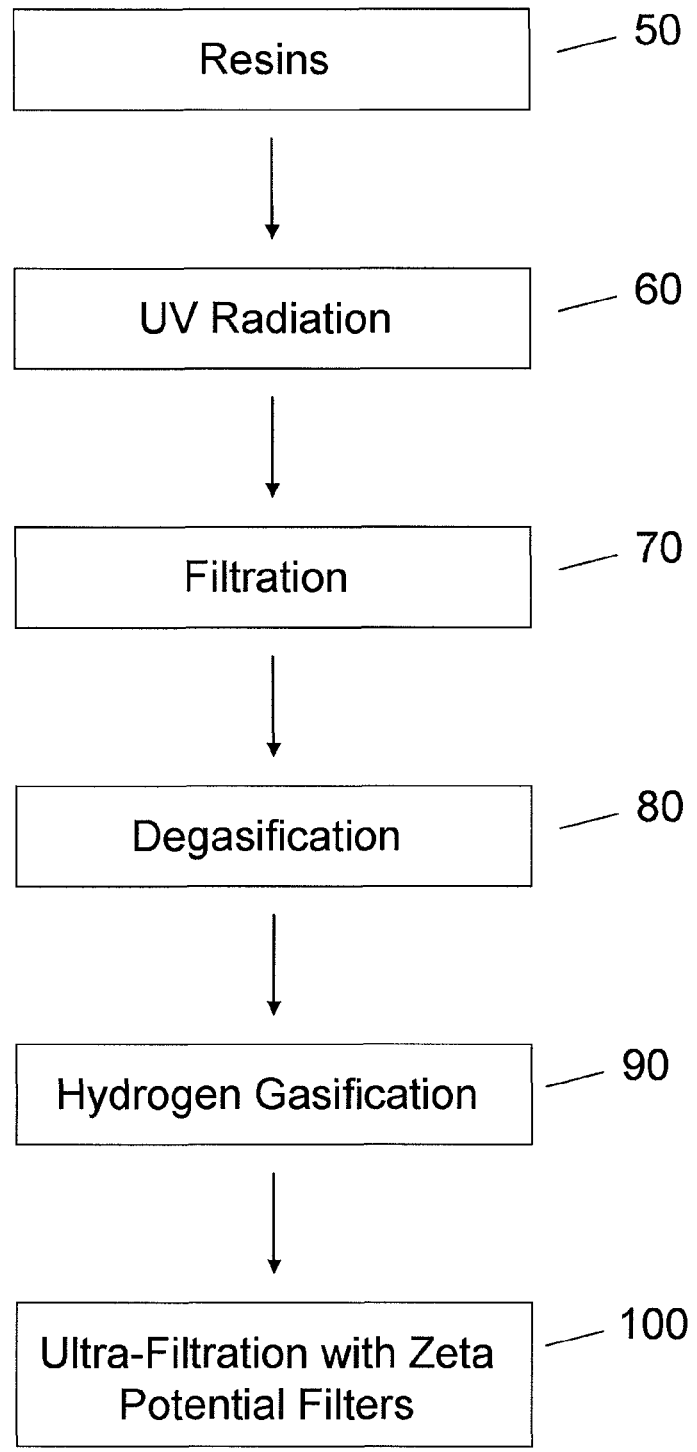
FIG. 3 is a block diagram illustrating a method of preparing water for semiconductor processing according to embodiments of the present invention.

Several water treatments are preferably employed to achieve these stringent levels of water purification. These treatments have substantial overlap with the methods illustrated in FIG. 3, with the significant exception that the treatments for the embodiments illustrated in FIG. 1 do not include gasifying the water with dissolved hydrogen. As such, description of the method of water treatment for use in all treatment and rinse steps is deferred until the methods illustrated by FIG. 3 are described.

The hydrofluoric acid used to form the dilute hydrofluoric acid is preferably gigabit grade (on the order of parts per trillion impurities) hydrofluoric acid with low levels of particles and dissolved metals, commercially available as Part No. 107101 in a 49% solution from Alameda Chemical of Tempe, Ariz., (480) 785-4685.

In the preferred embodiments, a high purity nitrogen purge curtain is employed at the air liquid interface during both the dilute hydrofluoric acid treatment step 20 and the rinse step 30 discussed below. The high purity nitrogen is filtered through a filter, which removes particles larger than 0.003 µm at the point of use. Ionizing the nitrogen before the nitrogen contacts the silicon wafer minimizes particles. The high purity nitrogen enhances particle neutrality and stable surface termination on the silicon wafer.

Rinse

After the silicon wafer is treated with dilute hydrofluoric acid in step 20, the silicon wafer is rinsed with ultrapure water for maximum hydrogen passivation of the treated silicon surface in the rinse step 30 of FIG. 1. The ultrapure water which is used for the rinse 30 desirably has the same purity as the ultrapure water which is used to form the dilute hydrofluoric acid to maintain stable hydrogen termination and particle neutrality. The treated silicon wafer is preferably rinsed with ultrapure water for a time period sufficient to remove all HF acid and particles from the previous etch step. The specific period of time depends upon the volume of the vessel used for treatment and the flow rate of the rinse water.

Preferably, the rinse is an in-situ rinse. Rinsing the silicon wafer in-situ in the vessel used for step 20 minimizes the amount of contamination, including reoxidation. Further, an in-situ rinse eliminates the step of transferring the silicon wafer to a rinse bath. Contamination of the silicon wafer would tend to occur during the transfer to the rinse bath. In the illustrated embodiment, the in-situ rinse is conducted at approximately room temperature (typically 20° C.-25° C., or about 23° C.). The in situ rinse is preferably a cascade/overflow rinse in either a single vessel processor or in a recirculating and filtered etch bath. Single vessel processors typically include integrated drying capability and single pass etch chemistry, in contrast to the recirculating and filtering etch bath.

An exemplary rinse step 30 involves an in-situ rinse in the vessel used for step 20 with ultrapure water at room temperature for approximately 15 minutes.

Drying

After the silicon wafer is rinsed with ultrapure water, the silicon wafer 50 is dried in the drying step 40 of FIG. 1. Although a variety of drying apparatuses are suitable for the drying step 40, the Rhetech 480ST is an exemplary spin/rinse dryer, commercially available from Rhetech, Inc. of Coopersburg, Pa. In an exemplary embodiment, the silicon wafer may be transferred to the spin/rinse dryer after rinsing in the in-situ rinse step 30. In the spin-only dry step 40, the silicon wafers are spun dry while hot, ionized nitrogen is flowed into the dryer at a rate of between about 15 slm and 25 slm. The hot nitrogen gas preferably at a temperature of 60° C. to 80° C., more preferably at a temperature of 60° C. to 80° C., and most preferably at a temperature of about 70° C. The dry cycle is carried out at 400 rpm to 600 rpm, without using the rinse cycle of the machine. The nitrogen stream is passed through a filter, which removes particles larger than 0.003 µm before entering the dryer. Thus, in an exemplary embodiment, the silicon wafer is dried in a drying step 40 at 500 rpm for 240 seconds for a bare silicon wafer or 480 seconds for a patterned silicon wafer with the heater on and antistat (ionization) on.

Alternatively, the drying step 40 may employ an isopropyl alcohol (IPA) based technique. Examples of IPA-based drying tools that would be suitable for embodiments of the present invention are the APET RD and the AP&S AeroSonic rinsing and drying tools. In some embodiments, the silicon wafer may be exposed to IPA as part of the treatment process prior to a $N_2$ dry step; in some embodiments the IPA treatment itself serves to dry the wafers.

In some embodiments, the drying step 40 may be carried out in the same vessel in which the treatment step 20 and the rinsing step 30 were carried out. Such embodiments advantageously avoid the necessity of a transfer step and the attending risk of surface contamination. Thus, embodiments of the present invention make possible the use of single vessel processors to carry out the treatment step 20, rinsing step 30, and drying step 40. Both of the aforementioned IPA-based drying tools are considered examples of single vessel processors when the available HF injection option is utilized for the initial etch step.

The drying step 40 is carried out until the silicon wafers are dry. The drying step 40 is preferably also optimized to ensure near particle neutrality (i.e. adds fewer than 0.032 particles/$cm^2$ having a size larger than 0.12 µm to the silicon surface) and stable surface termination on the silicon wafer.

The embodiments illustrated in FIG. 1 are simple and economical means of achieving a silicon wafer having high surface stability. All of the instrumentation used in the method are commercially available, and the process conditions are typically adaptable to most wet wafer cleaning processors.

Silicon wafers that are prepared by the embodiments illustrated by FIG. 1 have surfaces that are stable against oxidation for greater than 5 days, more preferably greater than 6 days, and most preferably greater than 8 days. A hydrogen-terminated silicon surface is considered "stable" against oxidation, as used herein, if the surface has an average thickness of less than 1 Å oxide on the surface when the silicon surface is stored in air in a clean room environment. The optimized conditions disclosed herein have showed as low as 0.1 Å oxide re-growth after 8 days.

In addition, the embodiments illustrated by FIG. 1 demonstrate a Particle Removal Efficiency (PRE) of greater than 25%, and preferably between 35% and 55%. Without being limited by a theory, it is believed that the stability of the hydrogen-terminated silicon surface produced with the preferred embodiments is aided by minimizing the number of particles added to the surface of the silicon surface during the steps of the method illustrated in FIG. 1. The PRE measures the Particle Count on the silicon surface after the drying step 40 compared to before the treatment step 20, according to the formula:

$$PRE=100*(PC_{Before\ Treating}-PC_{After\ Drying})/(PC_{Before\ Treating})$$

where "PRE" signifies Particle Removal Efficiency of the entire treatment/rinse/dry process and "PC" signifies Particle Count. Particle Counts for the above disclosed PREs were measured using a Tencor Surfscan® 6200 or SP-1 particle counter, available commercially from KLA-Tencor of San Jose, Calif.

It was noted above that prior to epitaxial deposition and diffusion processes on bare silicon surfaces, particularly for processes conducted at less than about 850° C., it is important to have a pristine silicon surface. Thus, the method illustrated in FIG. 1 is useful as a preparation of a silicon surface for later forming an epitaxial layer on the silicon surface, particularly for low temperature epitaxy at less than 850° C.

Advantages of the method illustrated in FIG. 1 include:
1. The processing is done at low temperatures;
2. The cost of the equipment and chemicals is low;
3. The method is readily accepted by customers;
4. The method can be employed using a wide range of commercially available equipment;
5. The etch chemistry is simple; and
6. The method is safe and produces a minimum of environmentally hazardous waste products.

Figure 2:
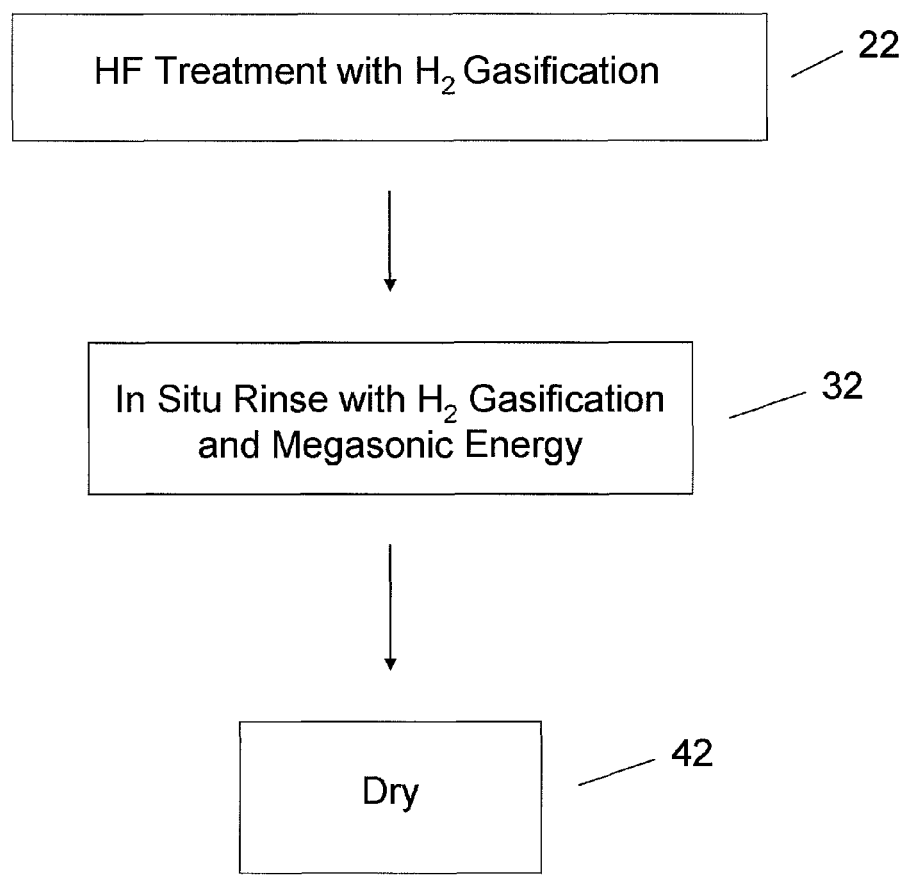
FIG. 2 is a block diagram illustrating a method of preparing a silicon surface according to other embodiments of the present invention.

FIG. 2 shows the steps in a second embodiment of the present invention. The first step 22 is a treatment with hydrofluoric acid diluted in hydrogen gasified water. The second step 32 is an in-situ rinse with hydrogen gasified water and megasonic energy. The third step 42 is a substrate drying step, which can be substantially the same as the drying step 40 illustrated in FIG. 1 and described above. The treatment step 22 and rinse step 32 will be described in more detail below. Because the drying step 42 can be substantially the same as the drying step 40 described above, a detailed description of that step is omitted below.

Significantly, the embodiments illustrated in FIG. 2 also avoid the necessity of an APM clean. Although the APM cleaning step 10 may be employed to obtain a silicon wafer having high stability according to certain embodiments of the method of the present invention, the APM clean has certain drawbacks that may make it desirable to omit the APM cleaning step 10. For example, the APM cleaning step 10 demands capital in the form of chemicals, equipment, and power consumption. Another significant capital expenditure in the APM cleaning step 10 is the additional cycle time it requires during the production of a silicon surface. Furthermore, the ammonium hydroxide, hydrogen peroxide, and the by-products associated with the APM cleaning step 10 may have the potential to introduce safety or environmental hazards. Moreover, the APM cleaning step 10 risks contaminating the silicon surface with fluorine, carbon, metals, or other contaminants that may be present in the cleaning solution. Such contamination on the surface may be detrimental to the thermal budget and/or the quality of the layer to be grown or deposited on the surface of the wafer.

Perhaps most importantly, the APM cleaning step 10 disadvantageously consumes silicon that is part of the substrate. Known methods for APM cleans typically consume approximately 3-5 Å of silicon a silicon surface. A loss of this thickness of silicon becomes increasingly problematic as features and components of integrated circuit devices become smaller. As such, embodiments of the present invention make it possible to omit the APM cleaning step 10, while still achieving the stability and particle removal efficiency of known methods for preparing a silicon surface.

Dilute Hydrofluoric Acid Treatment

The dilute hydrofluoric acid treatment step 22 according to the method illustrated in FIG. 2 is similar to step 20 of the method illustrated in FIG. 1, except that step 22 does not include anionic surfactant. In some embodiments, step 22 preferably includes diluting the hydrofluoric acid in hydrogen-gasified water, or otherwise hydrogenating the aqueous HF solution. The hydrogenation of the HF solution in the treatment step 22 advantageously creates a surplus of hydrogen radicals (H+) to enhance optimum Si—H terminations of the silicon surface during the dissociation and removal of the native oxide. Hydrogen gasified water can be prepared according to the method illustrated in FIG. 3, disclosed below and included in the preparation of the dilute HF solution. However, the advantageous stability and hydrogen termination can be obtained even in embodiments that do not utilize hydrogen gasified water in treatment step 22, but do employ hydrogen gasified water in rinse step 32.

Rinse

After the silicon wafer is treated with dilute hydrofluoric acid in step 22, the silicon wafer is rinsed in-situ with hydrogen gasified water in the in-situ rinse step 32 of FIG. 2. The hydrogen gasified water used for the in-situ rinse 32 desirably has a dissolved hydrogen concentration of 1.2 to 1.6 ppm, and is prepared according to the method illustrated in FIG. 3, which is described below. The use of hydrogen gasified water advantageously creates a surplus of hydrogen radicals (H+) to enhance optimum Si—H terminations during the rinse step and charges the zeta potential of particles suspended in the chemistry of the bath positively, deterring particles from adhering to the silicon surface. Thus, the hydrogen gasified water aids in forming or maintaining the hydrogen termination of the silicon surface, which aids in preventing contaminating particles from adhering to the surface of the silicon.

Preferably, megasonic energy is applied to the silicon surface during the rinse step. Supplementing the rinse step 32 with megasonic energy supplies a catalyst to the process of removing the particles on the silicon surface and to the beneficial hydrogen termination of the silicon surface. Megasonic energy is applied to the silicon surface at a frequency of 800 to 1200 kHz, and preferably at a frequency of 900 to 1000 kHz. The use of megasonic energy substantially reduces the required rinse time. With optimal conditions, this method has been used to prepare a silicon surface with a PRE of greater than 95% for the entire dHF treatment/in situ rinse/dry cycle with a rinse step 32 lasting only 2-3 minutes. An example of a transducer that can be utilized in this embodiment is available commercially from ProSys of Campbell, Calif. The transducer plate(s) of the megasonic system are mounted to the processing vessel to optimize the energy distribution uniformity across the silicon surface. This permits the H-radicals, which have a very short lifetime, to terminate the dangling silicon bonds.

Silicon wafers that are prepared by the embodiments illustrated by FIG. 2 have surfaces that are stable against oxidation for greater than 5 days, more preferably greater than 6 days, and most preferably greater than 8 days. In addition, the embodiments illustrated by FIG. 2 preferably have a Particle Removal Efficiency (PRE) of greater than 25%, and more preferably greater than 85%, and have demonstrated PRE of greater than 95% with the combination of megasonic energy and hydrogen gasification.

The method illustrated in FIG. 2 shares the primary advantages of the method illustrated in FIG. 1, which were described above.

FIG. 3 shows the steps in an embodiment of the present invention directed to preparing water for semiconductor processing. The first step 50 in that process is passing the water through resin beds in order to soften the water and remove solvents. The second step 60 is exposing the water to ultraviolet radiation to kill bacteria and fungi. The third step 70 is filtering the water to remove the particles formed in killing the bacteria and fungi, as well as other undesirable residual particles. The fourth step 80 is degasifying the water to minimize, inter alia, dissolved oxygen levels. The fifth step 90 is gasifying the water with dissolved hydrogen. The sixth step 100 is ultra-filtration, which utilizes a combination filter with positive and negative zeta charged media. Each of these steps will be described in greater detail below. This method may be undertaken in conjunction with or in preparation for the methods illustrated in FIG. 2.

In a preferred embodiment, municipal water is first softened by passing it though water softening resins (e.g., sodium zeolite cation resins) removing calcium and magnesium. A downstream reverse osmosis unit, such as the Filmtec⊥ BW30-4040, removes about 98% of total dissolved solvents. The water is then subjected to a primary demineralizer, preferably comprising a mixed bed of ion exchange resins. Exemplary polystyrene beads are available from Rohm & Haas in 40% anion resin/50% cation resin mix. A downstream resin trap (1 µm filter) leads to a storage tank lined with polyethylene, polyvinylidenefluoride (PVDF) or other suitable materials to avoid contamination. A 2,000 gallon tank is employed in the preferred embodiment.

Downstream of the storage tank, water is constantly looped through a plurality of further treatments to ensure purity prior to use. The further treatments include exposure to a first ultraviolet (UV) source, preferably comprising a 254 µm ultraviolet (UV), available commercially as part number 1H-8L TOC Reduction unit from WEDECO Ideal Horizons, Inc. of Poultney, Vt. Filters remove particles down to about 0.2 µm, and a mixed bed of ion exchange resins (50/50 mix of anion and cation exchangers), with an attendant resin trap filter separate the first UV source from a second UV source. In the preferred embodiments, the second UV source comprises a 185 nm narrow band UV lamp, commercially available from Ideal Horizons, Inc. of Poultney, Vt. as part number 1H-4L TOC Reduction unit. Treatment with ultraviolet light kills bacteria and fungi in the water. The particles formed by killing the bacteria and fungi are removed in other treatment steps. Another 0.2 µm filter desirably removes particles downstream of the second UV source.

The water purification system preferably also includes a plurality of monitors. In the preferred embodiment, the monitors includes a resistivity monitor (e.g., 200CR Resistivity Monitor, available from Thornton, Inc. of Waltham, Mass.) a pH monitor (e.g., part number 63221-1, also available from Thornton, Inc. of Waltham, Mass.) a total oxidizable carbon (TOC) analyzer (e.g., model A-1000 TOC Analysis System, available from Anatel Corp. of Boulder, Colo.) and a particle counter, also available from Anatel Corp.

Another preferred treatment involves removing dissolved oxygen from the ultrapure water to a level of 200 ppb or less. The dissolved oxygen is removed with a degasification module, such as the Liqui-Cel type G333, commercially available from Celgard of Charlotte, N.C. The water is preferably also filtered through zeta charged (+ and/or −) point of-use-filters to neutralize any particles in the water so that particle retention on the filters is maximized. The piping and as much of the rest of the purification system as possible are made of PVDF (polyvinylidenefluoride) to minimize contamination.

At this point, the water could be used for the method illustrated in FIG. 1, described above. In order to prepare the water for the method illustrated in FIG. 2, the water must is then gasified with hydrogen. An exemplary gasification module is available commercially under the trade name KHOW® SYSTEM from Kurita Water Industries Ltd. of Tokyo, Japan. Preferably, the water after hydrogen gasification has a dissolved hydrogen concentration of 1.2 to 1.6 ppm. Hydrogen gasified water is also known as "functional water."

Various modifications and alterations of this invention will be apparent to those skilled in the art without departing from the scope and spirit of this invention. It is to be understood that the invention is not limited to the embodiments disclosed herein, and that the claims should be interpreted as broadly as the prior art allows.

What is claimed is:

1. A method of preparing a silicon surface, comprising:
   treating the silicon surface with dilute hydrofluoric acid;
   in-situ rinsing the silicon surface with hydrogen gasified water to form a hydrogen-terminated silicon surface after treating, wherein the silicon surface is not exposed to air between treating and rinsing; and
   actively drying the hydrogen-terminated silicon surface after rinsing,
   wherein treating, in-situ rinsing, and actively drying are performed in a single vessel.

2. The method of claim 1, wherein the silicon surface remains hydrogen-terminated after drying.

3. The method of claim 1, wherein the rinsing comprises applying megasonic energy to the water.

4. The method of claim 3, wherein the megasonic energy comprises vibrations at a frequency of approximately 800 to 1200 kHz.

5. The method of claim 3, wherein the rinsing is conducted for approximately 2 to 3 minutes.

6. The method of claim 5, wherein treating, rinsing and drying has a particle removal efficiency of greater than 95%.

7. The method of claim 1, wherein the dilute hydrofluoric acid comprises hydrogen gasified water.

8. The method of claim 1, wherein the hydrogen gasified water is configured to positively charge the zeta potential of particles on the silicon surface.

9. The method of claim 1, wherein the drying comprises employing isopropyl alcohol.

10. The method of claim 1, wherein the hydrogen-terminated silicon surface grows a native oxide of less than 1 Å after exposure to air for more than about 6 days.

11. The method of claim 10, wherein the hydrogen-terminated silicon surface grows a native oxide of less than 1 Å after exposure to air for more than about 8 days.

12. The method of claim 1, further comprising:
    forming an epitaxial layer on the silicon surface; and
    forming an integrated circuit.

13. The method of claim 1, wherein in-situ rinsing is performed in the single vessel configured for a cascade/overflow rinse.

14. The method of claim 1, further comprising maintaining the hydrogen-terminated silicon surface for five days or more after drying.

15. The method of claim 1, wherein in-situ rinsing is conducted at approximately room temperature.

16. method of claim 1, wherein actively drying comprises exposing to $N_2$ subsequent to exposing to isopropyl alcohol.

17. A method of forming an integrated circuit, comprising:
exposing a surface of a substrate for formation of the integrated circuit to hydrogen gasified water to form a hydrogen-terminated substrate surface after treating the substrate surface with dilute hydrofluoric acid, wherein treating the surface and exposing the surface are conducted without subjecting the surface to air between treating and exposing; and
actively drying the hydrogen-terminated substrate surface after exposing,
wherein treating, exposing, and actively drying are performed in a single vessel.

18. The method of claim 17, wherein exposing the substrate surface to hydrogen gasified water comprises rinsing the substrate surface with hydrogen gasified water.

19. The method of claim 17, wherein the exposing comprises exposing the substrate surface to megasonic energy at a frequency of approximately 900 to 1000 kHz.

20. The method of claim 19, wherein the rinsing is conducted for approximately 2 to 3 minutes.

21. The method of claim 17, wherein the substrate surface is not cleaned with a solution comprising all three of ammonium hydroxide, hydrogen peroxide, and water before treating the surface.

22. The method of claim 17, wherein actively drying comprises exposing the hydrogen-terminated substrate surface to isopropyl alcohol.

23. The method of claim 17, further comprising maintaining the hydrogen-terminated substrate surface for five days or more after drying.

24. A method of treating a silicon surface, comprising:
treating the silicon surface with dilute hydrofluoric acid;
rinsing the silicon surface with hydrogen gasified water to form a hydrogen-terminated silicon surface after treating, wherein the silicon surface is not exposed to air between treating and rinsing; and
actively drying the hydrogen-terminated silicon surface after rinsing,
wherein treating, rinsing, and actively drying are performed in a single vessel.

25. The method of claim 24, wherein rinsing is conducted for approximately 2 to 3 minutes.

26. The method of claim 24, wherein the hydrogen gasified water has a dissolved hydrogen concentration of approximately 1.2 to 1.6 ppm.

27. The method of claim 19, further comprising maintaining the hydrogen-terminated silicon surface for five days or more after drying.

* * * * *

UNITED STATES PATENT AND TRADEMARK OFFICE
CERTIFICATE OF CORRECTION

| | | Page 1 of 1 |
|---|---|---|
| PATENT NO. | : 8,765,606 B2 | |
| APPLICATION NO. | : 12/251206 | |
| DATED | : July 1, 2014 | |
| INVENTOR(S) | : Robert H. Pagliaro, Jr. | |

It is certified that error appears in the above-identified patent and that said Letters Patent is hereby corrected as shown below:

On the Title Page

In column 2 (page 1, item 56) at line 17, Under Other Publications, change "ppl." to --pp.--.

In column 2 (page 2, item 56) at line 52, Under Other Publications, change "Balabian" to --Balaban--.

In the Specification

In column 9 at line 28, Change "Filmtec⊥" to --Filmtec™--.

In column 9 at line 41, Change "μm" to --nm--.

In the Claims

In column 11 at line 3, In Claim 16, Change "method" to --The method--.

Signed and Sealed this
Nineteenth Day of May, 2015

Michelle K. Lee
*Director of the United States Patent and Trademark Office*